(12) United States Patent
Pagaila et al.

(10) Patent No.: US 9,006,882 B2
(45) Date of Patent: Apr. 14, 2015

(54) SEMICONDUCTOR DEVICE AND METHOD OF FORMING RECESSED CONDUCTIVE VIAS IN SAW STREETS

(75) Inventors: Reza A. Pagaila, Singapore (SG); Byung Tai Do, Singapore (SG); Heap Hoe Kuan, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 475 days.

(21) Appl. No.: 12/719,398

(22) Filed: Mar. 8, 2010

(65) Prior Publication Data

US 2010/0155922 A1 Jun. 24, 2010

Related U.S. Application Data

(62) Division of application No. 12/133,177, filed on Jun. 4, 2008, now Pat. No. 7,704,796.

(51) Int. Cl.
*H01L 23/34* (2006.01)
*H01L 23/00* (2006.01)
(Continued)

(52) U.S. Cl.
CPC .............. *H01L 24/18* (2013.01); *H01L 21/568* (2013.01); *H01L 21/6835* (2013.01); *H01L 23/3128* (2013.01); *H01L 23/481* (2013.01); *H01L 25/03* (2013.01); *H01L 25/0657* (2013.01); *H01L 25/105* (2013.01); *H01L 25/50* (2013.01); *H01L 2221/68345* (2013.01); *H01L 2221/68359* (2013.01); *H01L 2224/16145* (2013.01); *H01L 2224/18* (2013.01); *H01L 2224/32145* (2013.01); *H01L 2224/48091* (2013.01); *H01L 2224/48225* (2013.01); *H01L 2224/48472* (2013.01); *H01L 2224/73215* (2013.01); *H01L 2224/73265* (2013.01); *H01L 2225/0651* (2013.01); *H01L 2225/06513* (2013.01); *H01L 2225/06517* (2013.01); *H01L 2225/06541* (2013.01); *H01L 2225/06568* (2013.01); *H01L 2924/01013* (2013.01); *H01L 2924/01029* (2013.01); *H01L 2924/0103* (2013.01); *H01L 2924/01073* (2013.01); *H01L 2924/01078* (2013.01); *H01L 2924/01079* (2013.01); *H01L 2924/01082* (2013.01); *H01L 2924/01322* (2013.01);
(Continued)

(58) Field of Classification Search
USPC .................... 257/686, 690, 723, 774, E23.01, 257/E23.169
See application file for complete search history.

(56) References Cited

U.S. PATENT DOCUMENTS 6,582,992 B2   6/2003   Poo et al.
6,753,205 B2   6/2004   Halahan
(Continued)

*Primary Examiner* — Whitney T Moore
*Assistant Examiner* — Joseph Galvin, III
(74) *Attorney, Agent, or Firm* — Robert D. Atkins Patent Law Group: Atkins and Associates, P.C.

(57) ABSTRACT

A semiconductor die has an insulating material disposed in a peripheral region around the die. A blind via is formed through the gap. A conductive material is deposited in the blind via to form a conductive via. A conductive layer is formed between the conductive via and contact pad on the semiconductor die. A protective layer is formed over the front side of the semiconductor die. A portion of the insulating material and conductive via is removed from a backside of the semiconductor die opposite the front side of the semiconductor die so that a thickness of the conductive via is less than a thickness of the semiconductor wafer. The insulating material and conductive via are tapered. The wafer is singulated through the gap to separate the semiconductor die. A plurality of semiconductor die can be stacked and electrically interconnected through the conductive vias.

24 Claims, 14 Drawing Sheets

(51) Int. Cl.

| | |
|---|---|
| *H01L 21/56* | (2006.01) |
| *H01L 21/683* | (2006.01) |
| *H01L 23/31* | (2006.01) |
| *H01L 25/03* | (2006.01) |
| *H01L 25/065* | (2006.01) |
| *H01L 25/10* | (2006.01) |
| *H01L 25/00* | (2006.01) |
| *H01L 23/48* | (2006.01) |

(52) U.S. Cl.
CPC ... *H01L 2924/12044* (2013.01); *H01L 2924/14* (2013.01); *H01L 2924/1433* (2013.01); *H01L 2924/15311* (2013.01); *H01L 2924/19041* (2013.01); *H01L 2924/19042* (2013.01); *H01L 2924/19043* (2013.01); *H01L 2924/19107* (2013.01); *H01L 2924/30105* (2013.01); *H01L 24/48* (2013.01); *H01L 2924/01006* (2013.01); *H01L 2924/01023* (2013.01); *H01L 2924/01033* (2013.01); *H01L 2924/01047* (2013.01); *H01L 2224/32225* (2013.01); *H01L 2924/1815* (2013.01); *H01L 2225/1088* (2013.01); *H01L 2225/1023* (2013.01); *H01L 2225/1058* (2013.01); *H01L 2224/04105* (2013.01); *H01L 2224/12105* (2013.01)

(56) References Cited

U.S. PATENT DOCUMENTS

| | | | |
|---|---|---|---|
| 6,908,856 | B2 | 6/2005 | Beyne et al. |
| 6,998,334 | B2 | 2/2006 | Farnworth et al. |
| 7,663,231 | B2 * | 2/2010 | Chang et al. ............... 257/724 |
| 7,718,900 | B2 * | 5/2010 | Takaike ...................... 174/254 |
| 7,910,385 | B2 * | 3/2011 | Kweon et al. ............... 438/18 |
| 2002/0189834 | A1 | 12/2002 | Goetschalckx |
| 2005/0200006 | A1 * | 9/2005 | Pu et al. ...................... 257/723 |
| 2005/0263869 | A1 | 12/2005 | Tanaka et al. |
| 2006/0079024 | A1 | 4/2006 | Akram |
| 2007/0138614 | A1 | 6/2007 | Harrison et al. |
| 2007/0269931 | A1 | 11/2007 | Chung et al. |
| 2008/0272465 | A1 | 11/2008 | Do et al. |
| 2008/0272476 | A1 | 11/2008 | Do et al. |
| 2009/0212401 | A1 | 8/2009 | Do et al. |
| 2009/0283870 | A1 | 11/2009 | Pagaila et al. |
| 2009/0294911 | A1 | 12/2009 | Pagaila et al. |
| 2009/0294992 | A1 * | 12/2009 | Toyama et al. ............. 257/778 |

* cited by examiner

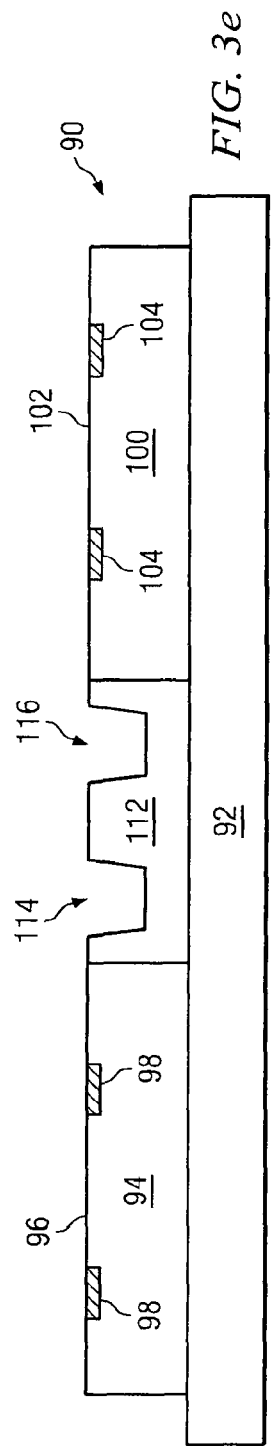
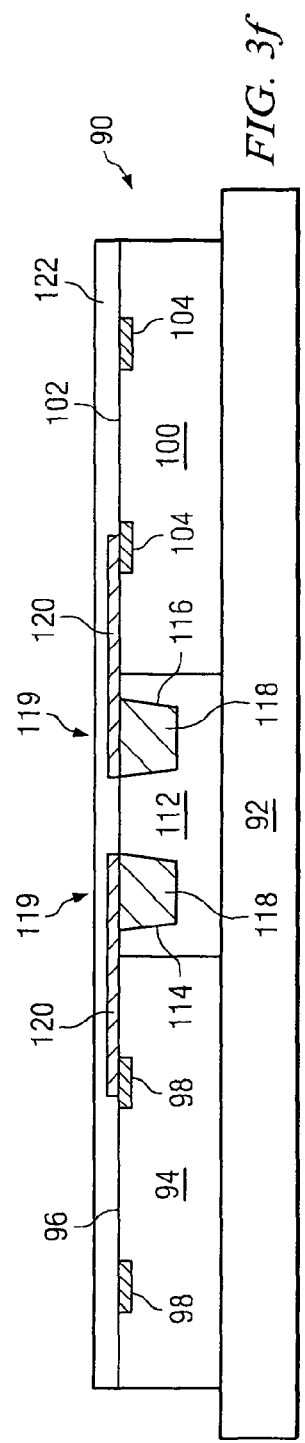
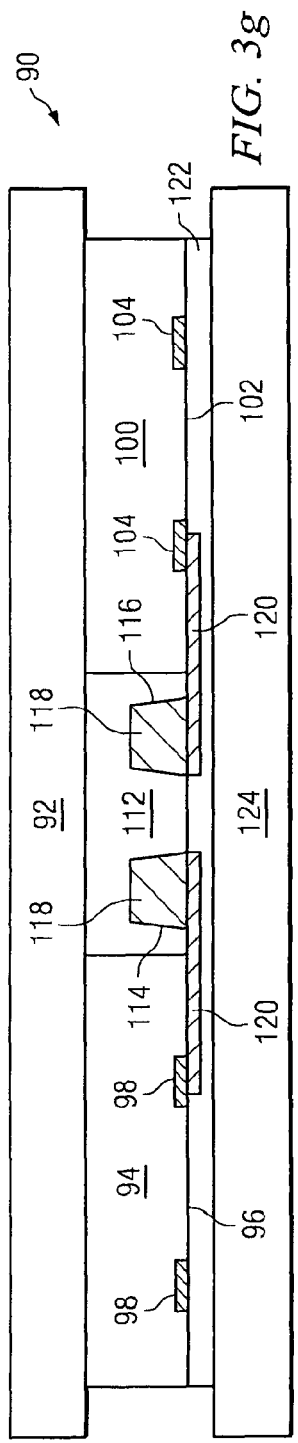

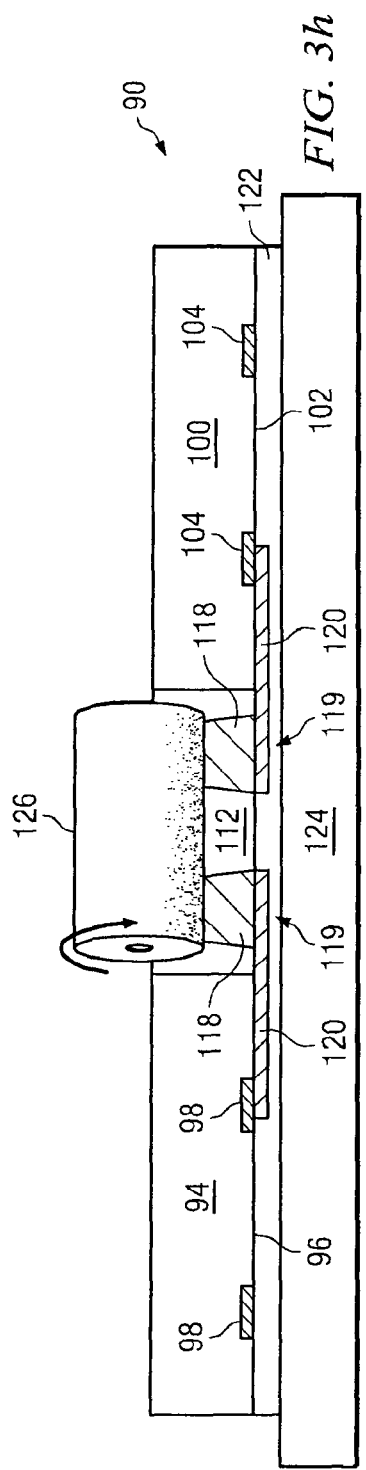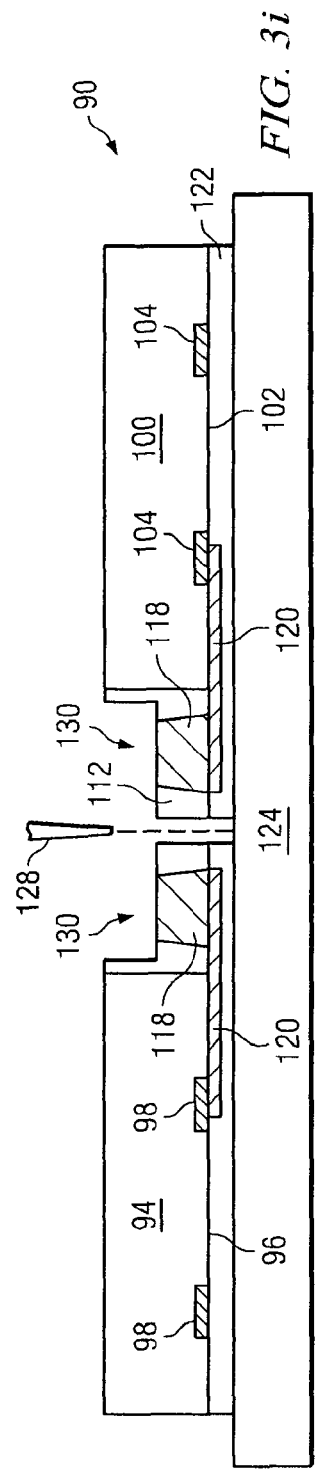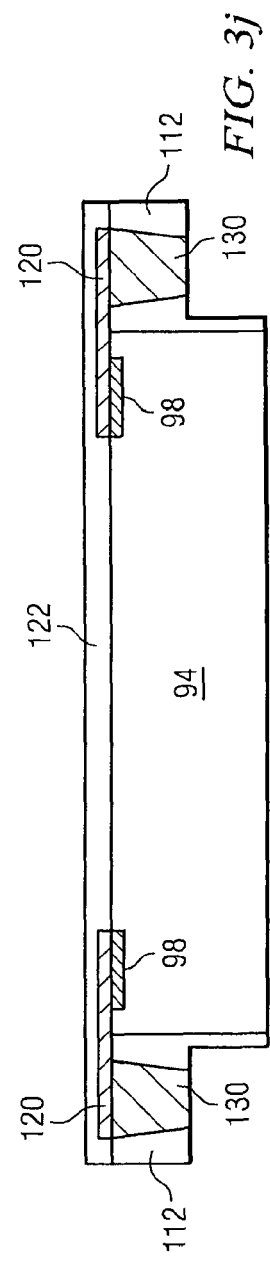
FIG. 3h
FIG. 3i
FIG. 3j

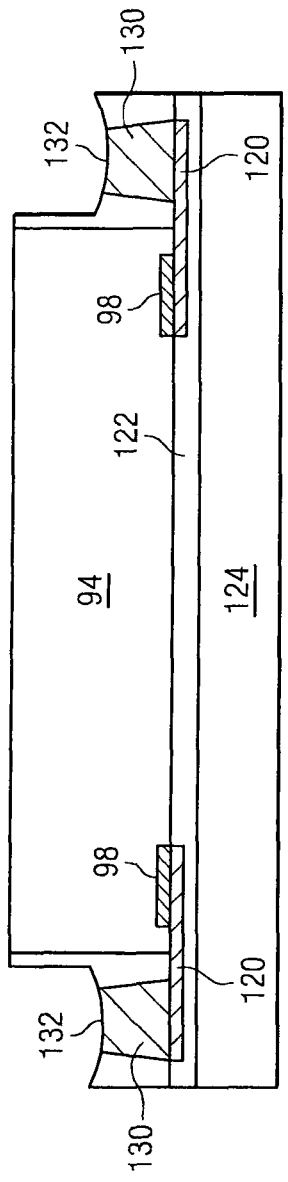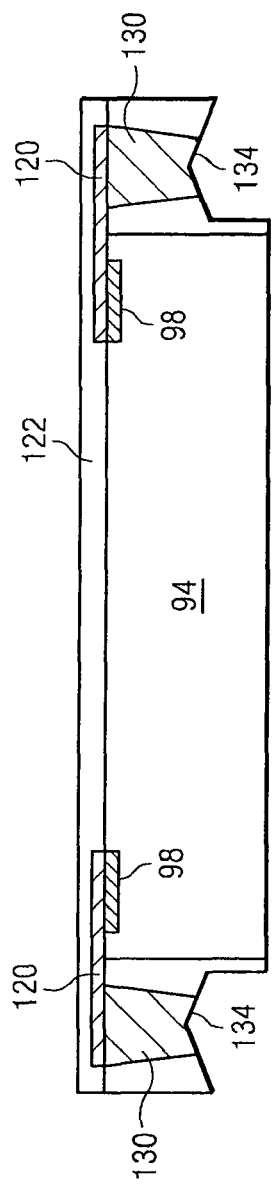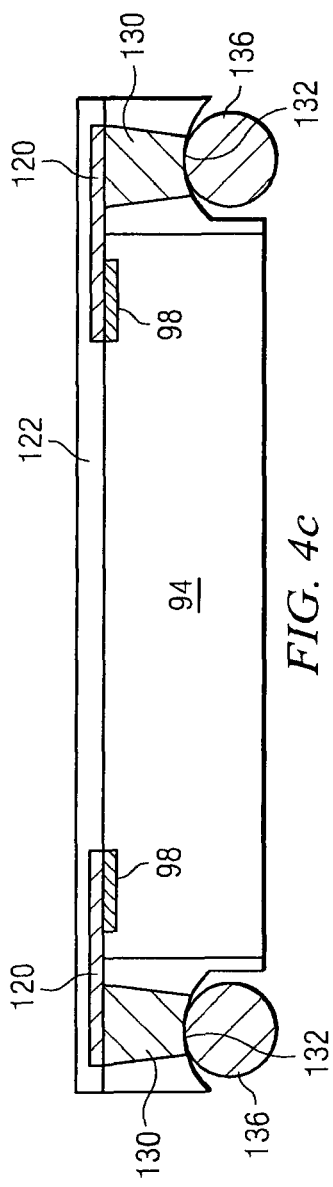

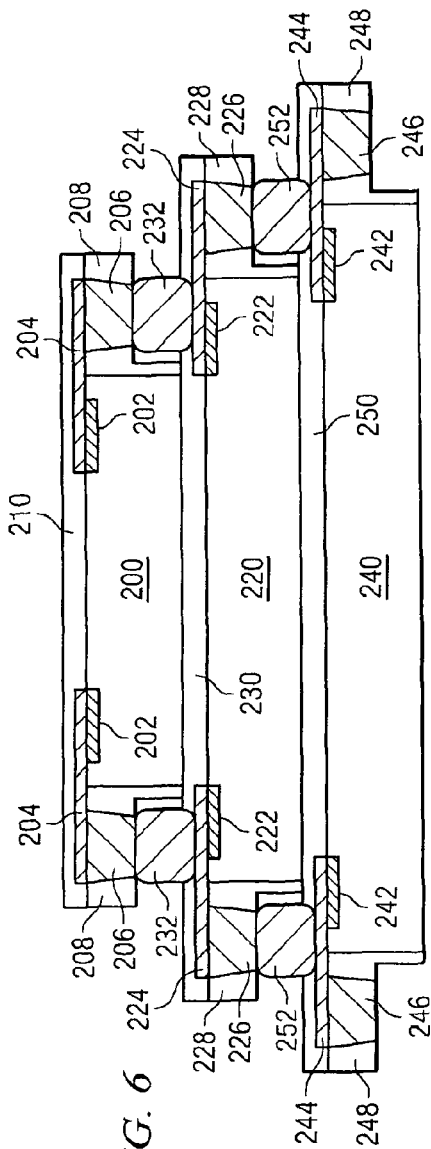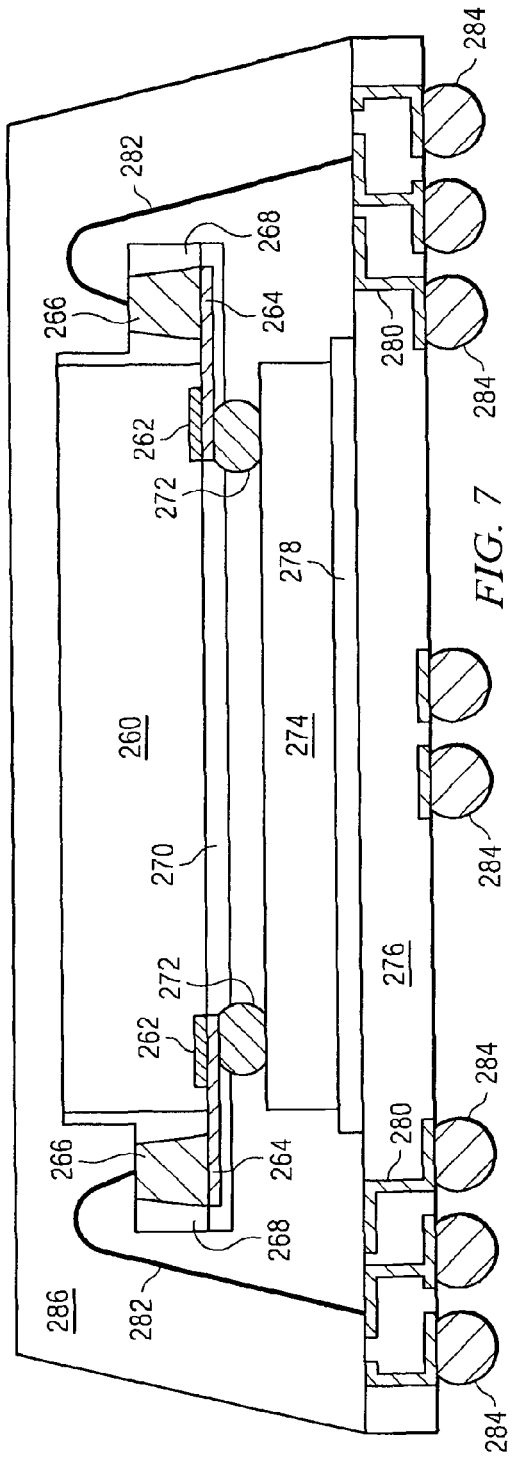

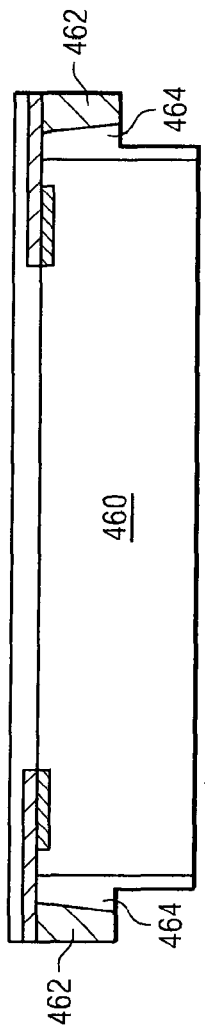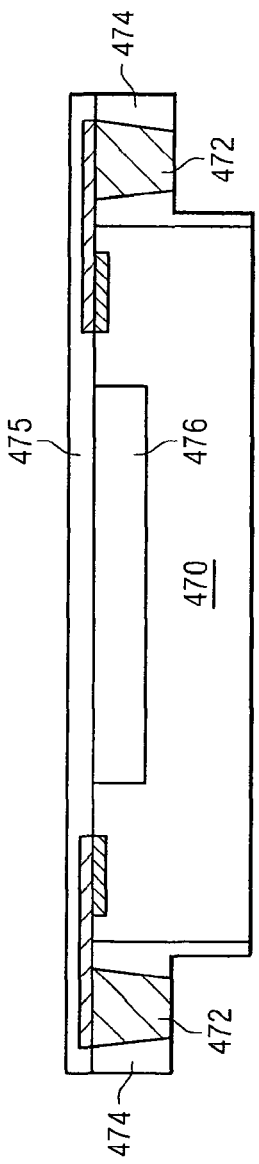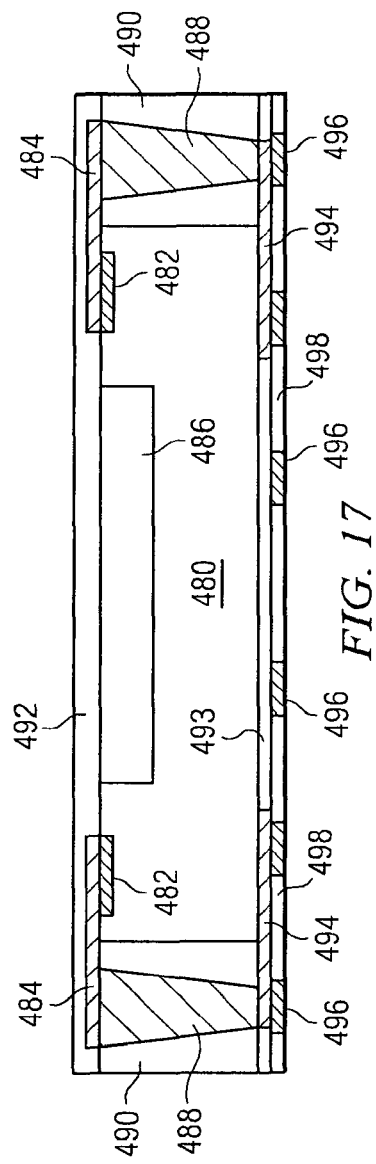

SEMICONDUCTOR DEVICE AND METHOD OF FORMING RECESSED CONDUCTIVE VIAS IN SAW STREETS

CLAIM TO DOMESTIC PRIORITY

The present application is a division of U.S. patent application Ser. No. 12/133,177, now U.S. Pat. No. 7,704,796, filed Jun. 4, 2008.

FIELD OF THE INVENTION

The present invention relates in general to semiconductor devices and, more particularly, to a semiconductor device having recessed conductive vias formed in a saw street region of a wafer around a periphery of a die.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die face down toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads, which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In many applications, it is desirable to vertically stack semiconductor die for greater device integration and minimize interconnect routing. The electrical interconnection between stacked semiconductor die has been done by using through hole vias which traverse from a front side to the backside of the die. The through hole vias are formed by drilling through the active area of the die or through saw streets on the wafer prior to any dicing operation. The through hole vias are filled with conductive material. The process of drilling through hole vias in the active area of the die or in saw streets on the wafer can cause damage to the wafer and/or die.

One example of using through hole vias is shown in US patent publication US20070269931. The reference shows a structure and fabrication method for a wafer level package with trenches formed on the backside of wafer to expose the through hole vias. The recessed via design uses a substantial portion of the silicon, which reduces die area for circuitry and limits the number of via that can be formed in practice. In addition, the recessed vias are disposed in close proximity to die area circuitry, which increases parasitic capacitance.

SUMMARY OF THE INVENTION

A need exists to interconnect stacked semiconductor die with conductive vias to reduce package thickness without consuming die area. Accordingly, in one embodiment, the present invention is a semiconductor device comprising a semiconductor die having a contact pad formed on a surface of the semiconductor die. An insulating material is formed around the semiconductor die. A portion of the insulating material has a thickness less than a thickness of the semiconductor die. A conductive via is formed through the portion of the insulating material having a thickness less than a thickness of the semiconductor die. A conductive layer is formed between the conductive via and contact pad formed on the surface of the semiconductor die. A protective layer is formed over the surface of the semiconductor die. A bump is formed over the conductive via.

In another embodiment, the present invention is a semiconductor device comprising a first semiconductor die having a contact pad formed on a surface of the first semiconductor die. An insulating material is formed around the first semiconductor die. A portion of the insulating material has a thickness less than a thickness of the first semiconductor die. A conductive via is formed through the portion of the insulating material having a thickness less than a thickness of the first semiconductor die. A conductive layer is formed between the conductive via and contact pad on the surface of the first semiconductor die.

In another embodiment, the present invention is a semiconductor device comprising a first semiconductor die and insulating material formed around the first semiconductor die. A portion of the insulating material has a thickness less than a thickness of the first semiconductor die. A conductive via is formed through the portion of the insulating material having a thickness less than a thickness of the first semiconductor die.

In another embodiment, the present invention is a semiconductor device comprising a first semiconductor die and first insulating material formed around the first semiconductor die. A portion of the first insulating material has a thickness less than a thickness of the first semiconductor die. A first conductive via is formed through the portion of the first insulating material having a thickness less than a thickness of the first semiconductor die. A second semiconductor die is mounted over the first semiconductor die. A second insulating material is formed around the second semiconductor die. A portion of the second insulating material has a thickness less than a thickness of the second semiconductor die. A second conductive via is formed through the portion of the second insulating material having a thickness less than a thickness of the second semiconductor die.

BRIEF DESCRIPTION OF THE DRAWINGS

FIGS. 3a-3j illustrate a process of forming recessed conductive vias in the saw street around a periphery of the die;

FIGS. 4a-4c illustrate a process of tapering the recessed conductive vias;

FIG. 6 illustrates vertically stacked semiconductor die of varying size with recessed conductive vias;

FIG. 7 illustrates a package-in-package arrangement with vertically stacked semiconductor die having recessed conductive vias;

FIG. 15 illustrates a semiconductor die with recessed conductive half-vias;

FIG. 16 illustrates a semiconductor die with an optical device and recessed conductive vias; and FIG. 17 illustrates a semiconductor die with an optical device and conductive vias formed through the die without recess.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
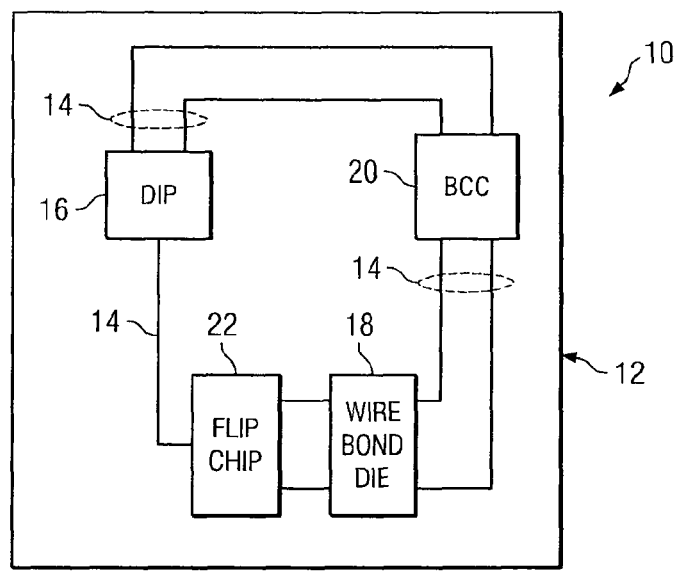
FIG. 1 illustrates a PCB with different types of packages mounted to its surface.

FIG. 1 illustrates electronic device 10 having a chip carrier substrate or printed circuit board (PCB) 12 with a plurality of semiconductor packages or semiconductor die mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, radio frequency (RF) circuits, discrete devices, or other semiconductor die or electrical components.

In FIG. 1, PCB 12 provides a general substrate for structural support and electrical interconnect of the semiconductor packages and other electronic components mounted on the PCB. Conductive signal traces 14 are formed on a surface or within layers of PCB 12 using evaporation, electrolytic plating, electroless plating, screen printing, or other suitable metal deposition process. Signal traces 14 provide for electrical communication between each of the semiconductor packages, mounted components, and any connected external system components. Traces 14 also provide power and ground connections to each of the semiconductor packages.

For the purpose of illustration, several types of semiconductor packages, including a dual in-line package (DIP) 16, wire-bonded die 18, bump chip carrier (BCC) 20, and flip-chip package 22, are shown mounted on PCB 12. Depending upon the system requirements, any combination of semiconductor packages or other electronic components can be connected to PCB 12. In some embodiments, electronic device 10 includes a single attached semiconductor package, while other embodiments call for multiple interconnected packages. By combining one or more semiconductor packages over a single substrate, manufacturers can incorporate premade components into electronic devices and systems. Because the semiconductor packages include sophisticated functionality and represent known good units (KGUs), electronic devices can be manufactured using cheaper components and shorten the manufacturing process. The resulting devices are less likely to fail and less expensive to manufacture resulting in lower costs for consumers.

Figure 2A:
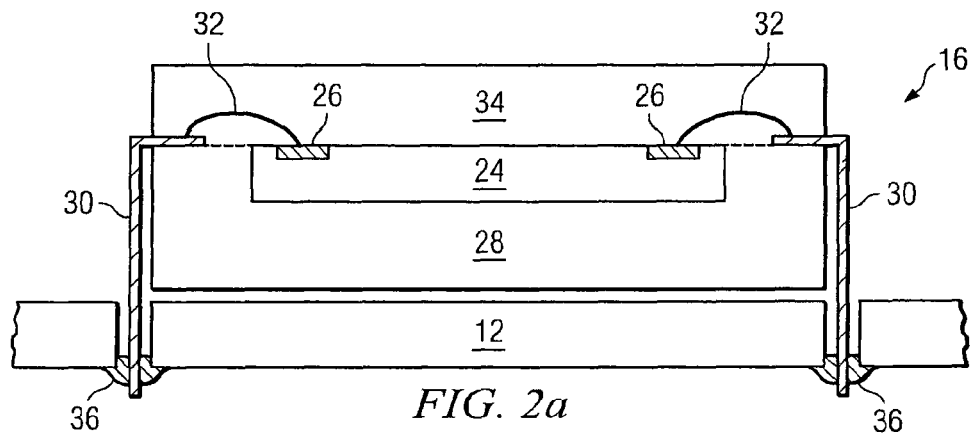
FIGS. 2a-2d illustrate further detail of the semiconductor packages mounted to the PCB.

FIG. 2a illustrates further detail of DIP 16 mounted on PCB 12. DIP 16 includes semiconductor die 24 having contact pads 26. Semiconductor die 24 includes an active area containing analog or digital circuits implemented as active devices, passive devices, conductive layers, and dielectric layers formed within semiconductor die 24 and are electrically interconnected according to the electrical design of the die. For example, the circuit may include one or more transistors, diodes, inductors, capacitors, resistors, and other circuit elements formed within the active area of die 24. Contact pads 26 are made with a conductive material such as aluminum (Al), copper (Cu), tin (Sn), nickel (Ni), gold (Au), or silver (Ag), and are electrically connected to the circuit elements formed within die 24. Contact pads 26 are formed by a physical vapor deposition (PVD), chemical vapor deposition (CVD), electrolytic plating, or electroless plating process. During assembly of DIP 16, semiconductor die 24 is mounted to a die attach area of lower portion 28 of the package body using a gold-silicon eutectic layer or adhesive material, such as thermal epoxy. The package body includes an insulative packaging material such as plastic or ceramic. Conductor leads 30 are connected to lower portion 28 of the body and bond wires 32 are formed between leads 30 and contact pads 26 of die 24. Encapsulant 34 is deposited over the package for environmental protection by preventing moisture and particles from entering the package and contaminating die 24, contact pads 26, or bond wires 32. DIP 16 is connected to PCB 12 by inserting leads 30 into holes formed through PCB 12. Solder material 36 is flowed around leads 30 and into the holes to physically and electrically connect DIP 16 to PCB 12. Solder material 36 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high lead, or lead free.

Figure 2B:
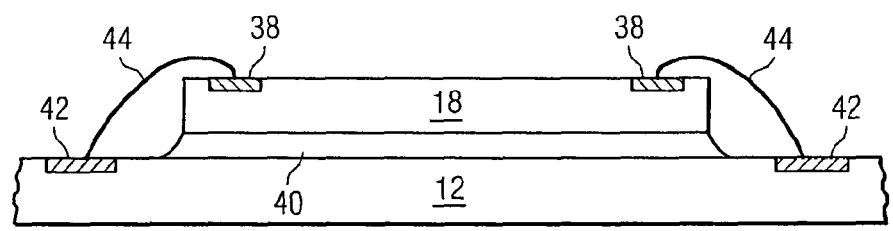

Referring to FIG. 2*b*, a wire-bonded die 18 having contact pads 38 is mounted to PCB 12 using adhesive material 40. Contact pads 42 are formed on the surface of PCB 12 and electrically connect to one or more traces 14 formed on or within the layers of PCB 12. Bond wires 44 are formed between contact pads 38 of die 18 and contact pads 42 of PCB 12.

Figure 2C:
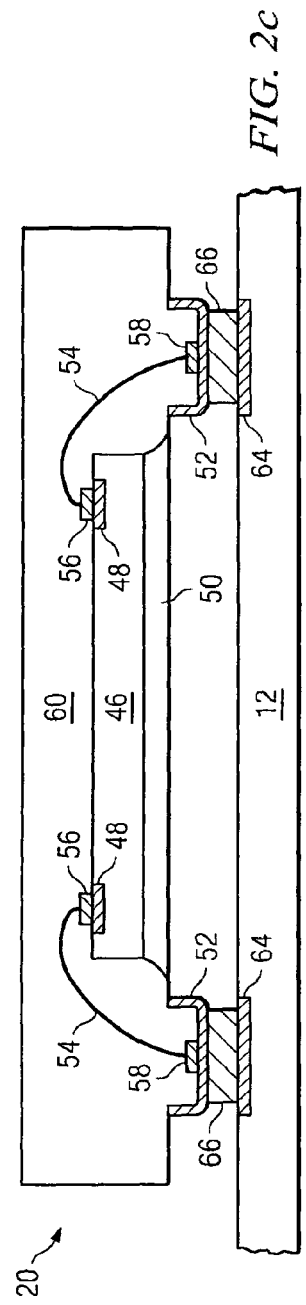

FIG. 2*c* illustrates further detail of BCC 20 with an incorporated semiconductor die, integrated circuit (IC), or combination thereof. Semiconductor die 46 having contact pads 48 is mounted over a carrier using an underfill or epoxy-resin adhesive material 50. Semiconductor die 46 includes an active area containing analog or digital circuits implemented as active devices, passive devices, conductive layers, and dielectric layers formed within semiconductor die 46 and are electrically interconnected according to the electrical design of the die. For example, the circuit may include one or more transistors, diodes, inductors, capacitors, resistors, and other circuit elements formed within the active area of die 46. Contact pads 48 are connected to the electrical devices and circuitry formed within the active area of die 46. Bond wires 54 and bond pads 56 and 58 electrically connect contact pads 48 of die 46 to contact pads 52 of BCC 20. Mold compound or encapsulant 60 is deposited over die 46, bond wires 54 and contact pads 52 to provide physical support and electrical insulation for the device. Contact pads 64 are formed on PCB 12 and electrically connect to one or more conductive signal traces 14. Solder material is deposited between contact pads 52 of BCC 20 and contact pads 64 of PCB 12. The solder material is reflowed to form bumps 66 which form a mechanical and electrical connection between BCC 20 and PCB 12.

Figure 2D:
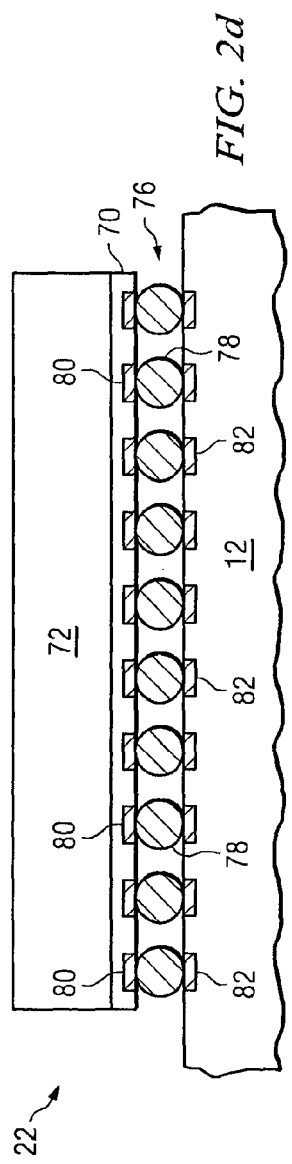

In FIG. 2*d*, flip chip style semiconductor device 22 has a semiconductor die 72 with active area 70 mounted face down toward PCB 12. Active area 70 containing analog or digital circuits implemented as active devices, passive devices, conductive layers, and dielectric layers formed within semiconductor die 72 is electrically interconnected according to the electrical design of the die. For example, the circuit may include one or more transistors, diodes, inductors, capacitors, resistors, and other circuit elements formed within active area 70 of die 72. The electrical and mechanical interconnect is achieved through solder bump structure 76 comprising a large number of individual conductive solder bumps or balls 78. The solder bumps are formed on bump pads or interconnect sites 80, which are disposed on active area 70. The bump pads 80 connect to the active circuits by conduction tracks in active area 70. The solder bumps 78 are electrically and mechanically connected to contact pads or interconnect sites 82 on PCB 12 by a solder reflow process. The interconnect sites 82 are electrically connected to one or more conductive signal traces 14 on PCB 12. The flip chip semiconductor device provides a short electrical conduction path from the active devices on die 72 to conduction tracks on PCB 12 in order to reduce signal propagation distance, lower capacitance, and achieve overall better circuit performance.

Figure 3A:
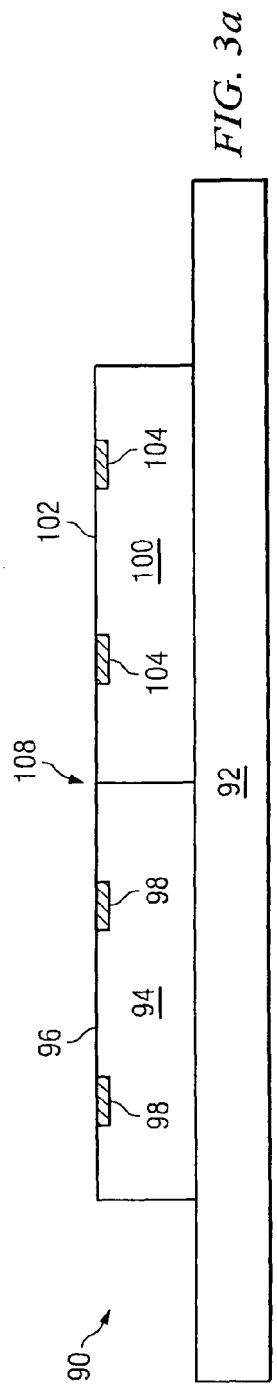

FIGS. 3*a*-3*j* illustrate a process of forming conductive vias in a peripheral region around a semiconductor die in a wafer level chip scale package (WLCSP). To start the process, a plurality of semiconductor die is formed on a semiconductor wafer 90 using conventional integrated circuit processes, as described above. The semiconductor wafer, containing semiconductor die 94 and 100, is mounted to expansion table 92 with ultraviolet (UV) tape, as shown in FIG. 3*a*. The backside of semiconductor die 94 is affixed to expansion table 92 with its front side, i.e., active surface 96 and contact pads 98, oriented face up. Likewise, the backside of semiconductor die 100 is mounted to expansion table 92 with its front side, i.e., active surface 102 and contact pads 104, oriented face up. Contact pads 98 and 104 electrically connect to active and passive devices and signal traces in active areas 96 and 102 of semiconductor die 94 and 100, respectively.

Figure 3B:
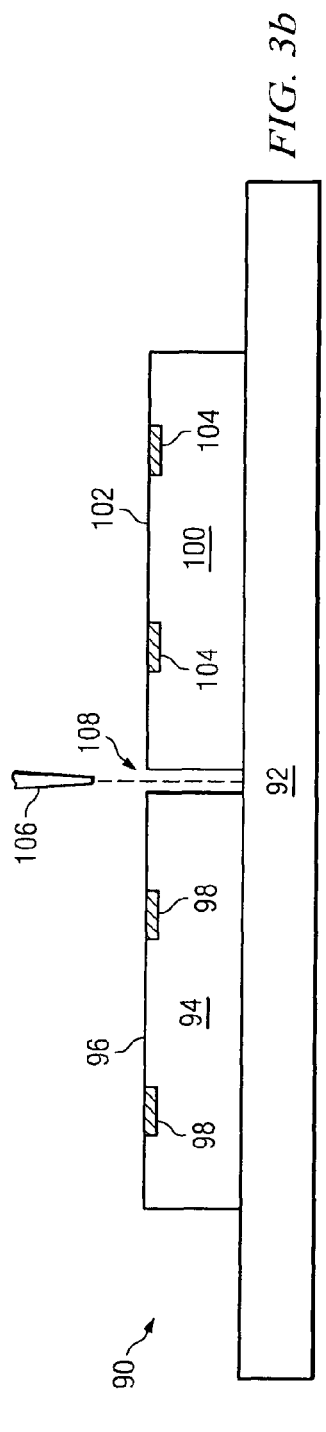
Figure 3C:
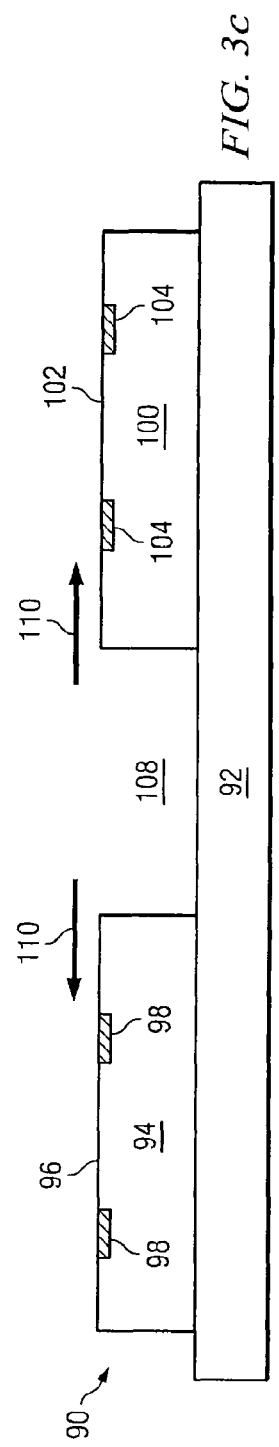

In FIG. 3*b*, a saw blade or laser tool 106 cuts through saw street 108 between semiconductor die 94 and 100 in a dicing operation. In FIG. 3*c*, expansion table 92 moves in two-dimension lateral directions, as shown by arrows 110, to expand the width of saw street 108, i.e., form a gap to create a greater physical separation between the die. Expansion table 92 moves substantially the same distance in the x-axis and y-axis to provide equal separation around a periphery of each die. The post-expansion width of gap 108 ranges from 5 micrometers (μm) to 200 μm. The expanded dimension depends on the design embodiment, i.e., half-via, full-via, single row via, or double/multiple row via. The expanded gap 108 defines a peripheral region around the semiconductor die.

In an alternate embodiment, the semiconductor wafer is diced to separate the semiconductor die. The individual semiconductor die are then transferred and affixed to a temporary chip carrier with an adhesive layer, e.g., thermal epoxy. The semiconductor die are placed on the chip carrier so as to have a predetermined separation gap. In general, the separation gap has sufficient width to form conductive vias within the gap, as described below.

Figure 3D:
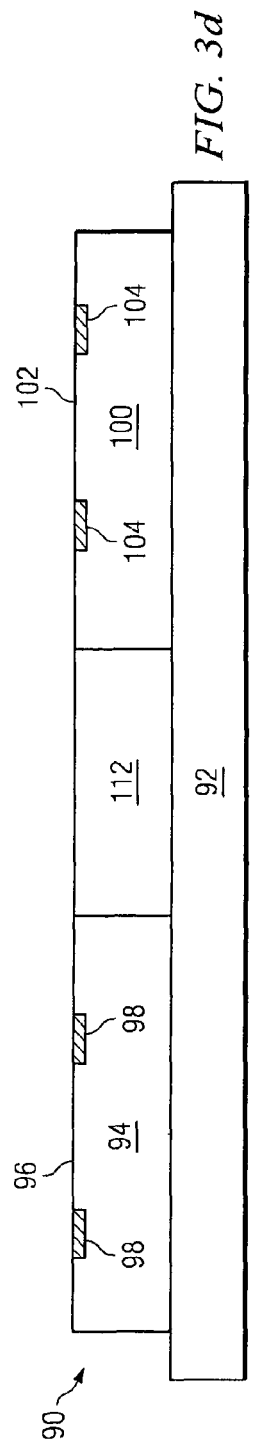

In FIG. 3*d*, an organic insulating material 112 is deposited in gap 108 using spin coating, needle dispensing, or other suitable application process. Organic material 112 can be benzocyclobutene (BCB), polyimide (PI), or acrylic resin. Alternatively, other non-conductive materials such as a polymer molding compound, liquid epoxy molding, compression molding, soft laminating film, or other material having dielectric or electrical insulating properties can be deposited in gap 108. The non-conductive materials can also be deposited using a transfer molding or injection molding process.

In FIG. 3*e*, first and second portions of organic material 112 are removed by laser drilling or etching to create blind or partial vias 114 and 116. Blind vias 114 and 116 extend only partially through organic material 112 to save production costs. In an alternative embodiment, vias 114 and 116 are formed as through hole vias extending down to expansion table 92. The walls of the remaining portion of organic material 112, which define vias 114 and 116, can be vertical or tapered.

An electrically conductive material 118 is deposited in blind vias 114 and 116 with an optional seed layer. Conductive material 118 can be Al, Cu, Sn, Ni, Au, or Ag. The seed layer can be made with Cu, Ni, nickel vanadium (NiV), Au, or Al. The seed layer and conductive material 118 are patterned and deposited using an electrolytic plating, electroless plating, sputtering, PVD, CVD, or other suitable metal deposition process. The conductive material 118 in blind vias 114 and 116 forms conductive vias 119.

An electrically conductive layer or redistribution layer (RDL) 120 is patterned and deposited on active surface 96 of semiconductor die 94 and active surface 102 of semiconductor die 100 using an evaporation, electrolytic plating, electroless plating, or other suitable metal deposition process. RDL 120 can be made with Al, Cu, Sn, Ni, Au, Ag, or other suitable conductive material. RDL 120 extends from contact pads 98 and 104 to conductive via 119, as shown in FIG. 3f.

A protective layer 122 is formed over RDL 120, organic material 112, and semiconductor die 94 and 100 for structural support and electrical isolation. The protective layer 122 can be photoresist, solder mask, or passivation material, such as silicon nitride (SiN), silicon dioxide (SiO2), silicon oxynitride (SiON), tantalum pentoxide (Ta2O5), zircon (ZrO2), aluminum oxide (Al2O3), polyimide (Pi), benzocyclobutene (BCB), polybenzoxazole (PBO), epoxy-based polymers, or other insulating material. Protective layer 122 can be formed by lamination after RDL 120 is laid down.

In FIG. 3g, the assembly is inverted and wafer carrier 124 is attached to the front side of semiconductor die 94 and 100 using UV or thermal release adhesive. Semiconductor wafer 90 is then removed from expansion table 92 as per FIG. 3h. Grinding wheel 126 removes a portion of organic material 112 and conductive material 118 in blind vias 114 and 116 from the backside of the semiconductor wafer opposite active surfaces 96 and 102. The grinding process leaves conductive vias 130 recessed with respect to the back surface of semiconductor wafer 90. That is, after the grinding process, conductive via 130 has a thickness less than a thickness of semiconductor wafer 90. In one embodiment, given a wafer thickness of 25-200 µm, the backside of semiconductor wafer is ground to a depth of 12.5-100 µm, leaving conductive via 130 with a thickness of 12.5-100 µm. In general, the grinding process removes about less than fifty percent of the thickness of semiconductor wafer 90, leaving more than fifty percent of the thickness of the wafer to contain the conductive via.

Semiconductor wafer 90 is singulated in FIG. 3i through a center portion of gap 108, i.e., between blind vias 114 and 116. The gap region is cut by a cutting tool 128 such as a saw blade or laser. The cutting tool completely severs the gap region to separate the die. The semiconductor die are removed from carrier 124. FIG. 3j shows semiconductor die 94 with recessed conductive vias 130 following wafer singulation.

In an alternate embodiment, the conductive via 130 are formed in a peripheral region around semiconductor die 94 as described in FIGS. 3a-3i. After grinding to a flat profile, as shown in FIG. 3h, recessed conductive vias 130 are given a rounded or conical profile 132 by isotropic etch, see FIG. 4a. The rounded profile 132 can also be realized with a rounded tip grinder or water jet. FIG. 4b shows recessed conductive via 130 with a tapered profile 134. Profile 134 can be formed by a tapered saw to increase interconnect area on the conductive via.

In FIG. 4c, an electrically conductive solder material is deposited in rounded profile 132 of conductive via 130 using an evaporation, electrolytic plating, electroless plating, ball drop, or screen printing process. The solder material can be any metal or electrically conductive material, e.g., Sn, Ni, Au, Ag, Pb, Bi, and alloys thereof. For example, the solder material can be eutectic Sn/Pb, high lead, or lead free. The solder material is reflowed by heating the solder material above its melting point to form spherical balls or bumps 136. In some applications, solder bumps 136 are reflowed a second time to improve electrical contact to the conductive vias 130.

Figure 5:
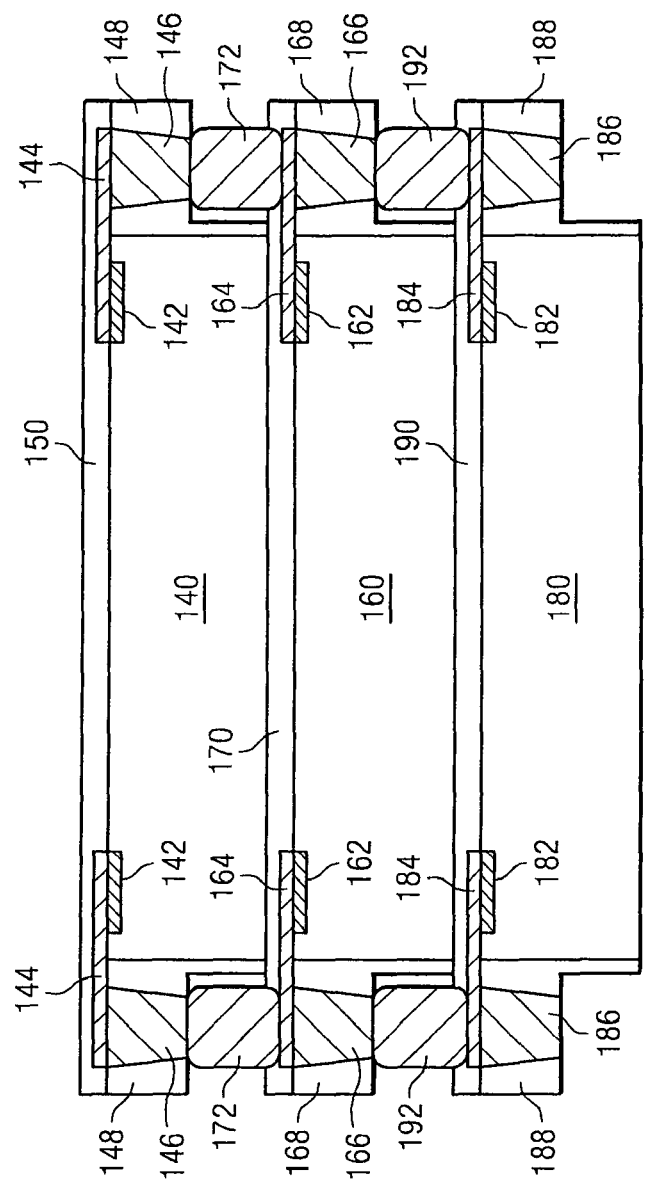
FIG. 5 illustrates vertically stacked semiconductor die with recessed conductive vias.

FIG. 5 shows stacked semiconductor die 140, 160, and 180. Semiconductor die 140 includes contact pads 142 electrically connected through conductive layer 144 to conductive vias 146. The conductive vias 146 are formed in organic material 148 and recessed with respect to the back surface of die 140, as described in FIGS. 3a-3j. Protective layer 150 is formed over conductive layer 144 and semiconductor die 140. A build-up interconnect layer can be formed over protective layer 150 for high density mounting to interposer substrate or printed circuit board (PCB). Semiconductor die 160 includes contact pads 162 electrically connected through conductive layer 164 to conductive vias 166. The conductive vias 166 are formed in organic material 168 and recessed with respect to the back surface of die 160. Protective layer 170 is formed over conductive layer 164 and semiconductor die 160. A portion of protective layer 170 is removed by an etching process to expose conductive layer 164. Conductive via 166 is electrically connected to conductive layer 164 and conductive via 166 with solder bumps 172. The interconnect between conductive via 146 and conductive via 166 can also be conductive adhesive, metal-to-metal bonding, or other suitable electrically conductive union. Semiconductor die 180 includes contact pads 182 electrically connected through conductive layer 184 to conductive vias 186. The conductive vias 186 are formed in organic material 188 and recessed with respect to the back surface of die 180. Protective layer 190 is formed over conductive layer 184 and semiconductor die 180. A portion of protective layer 190 is removed by an etching process to expose conductive layer 184. Conductive via 186 is electrically connected to conductive layer 184 and conductive via 166 with solder bumps 192. The interconnect between conductive via 166 and conductive via 186 can also be conductive adhesive, metal-to-metal bonding, or other suitable electrically conductive union. The recessed conductive vias reduce the overall height of the stacked semiconductor die 140, 160, and 180 because some of the space needed for solder bumps 172 and 192 is provided by the recessed feature of conductive vias 146, 166, and 186. The recessed conductive vias further reduce use of conductive materials which saves manufacturing costs.

FIG. 6 shows semiconductor die 200, 220, and 240 stacked in a pyramid arrangement. Semiconductor die 200 is smaller than semiconductor die 220, which is smaller than semiconductor die 240. The pyramid stacking arrangement is applicable to memory and logic devices. In one embodiment, the memory device is a dynamic random access memory (DRAM). Semiconductor die 200 includes contact pads 202 electrically connected through conductive layer 204 to conductive vias 206. The conductive vias 206 are formed in organic material 208 and recessed with respect to the back surface of die 200, as described in FIGS. 3a-3j. Protective layer 210 is formed over conductive layer 204 and semiconductor die 200. A build-up interconnect layer can be formed over protective layer 210 for high density mounting to interposer substrate or PCB. Semiconductor die 220 includes contact pads 222 electrically connected through conductive layer 224 to conductive vias 226. The conductive vias 226 are formed in organic material 228 and recessed with respect to the back surface of die 220. Protective layer 230 is formed over conductive layer 224 and semiconductor die 220. A portion of protective layer 230 is removed by an etching process to expose conductive layer 224. Conductive via 206 is electrically connected to conductive layer 224 and conductive via 226 with solder bumps 232. The interconnect between conductive via 206 and conductive via 226 can also be conductive adhesive, metal-to-metal bonding, or other suitable electrically conductive union. Semiconductor die 240 includes contact pads 242 electrically connected through conductive layer 244 to conductive vias 246. The conductive vias 246 are formed in organic material 248 and recessed with respect to the back surface of die 240. Protective layer 250 is formed over conductive layer 244 and semiconductor die 240. A portion of protective layer 250 is removed by an etching process to expose conductive layer 244. Conductive via 226 is electrically connected to conductive layer 244 and conductive via 246 with solder bumps 252. The interconnect between conductive via 226 and conductive via 246 can also be conductive adhesive, metal-to-metal bonding, or other suitable electrically conductive union. The recessed conductive vias reduce the overall height of the stacked semiconductor die 200, 220, and 240 because some of the space needed for solder bumps 232 and 252 is provided by the recessed feature of conductive vias 206, 226, and 246. The recessed conductive vias further reduce use of conductive materials which saves manufacturing costs.

FIG. 7 illustrates a package-in-package (PiP) configuration. Semiconductor die 260 includes contact pads 262 electrically connected through conductive layer 264 to conductive vias 266. The conductive vias 266 are formed in organic material 268 and recessed with respect to the back surface of die 260, as described in FIGS. 3a-3j. Protective layer 270 is formed over conductive layer 264 and semiconductor die 260. A portion of protective layer 270 is removed by an etching process to expose conductive layer 264. Solder bumps 272 are formed on conductive layer 264. Flip chip type semiconductor die 274 is mounted to PCB 276 with adhesive or underfill material 278. Semiconductor die 274 electrically connects to semiconductor die 260 through solder bumps 272. Semiconductor die 260 also electrically connects to interconnect structure 280 in PCB 276 by way of bond wires 282. Solder bumps 284 are formed on interconnect structure 280 to provide external connectivity for the PiP device. A molding compound or encapsulant 286 is deposited over semiconductor device 260 and bond wires 282 and PCB 276. Molding compound 286 can be made with epoxy acrylate or other polymer material and applied by transfer molding, liquid encapsulant molding, or other molding process. Molding compound 286 is non-conductive and environmentally protects the semiconductor device from external elements and contaminants. The stand-off height of encapsulant 286 needed for bond wires 282 can be reduced because some of the space needed for bond wires 282 is provided by the recessed feature of conductive vias 266.

Figure 8:
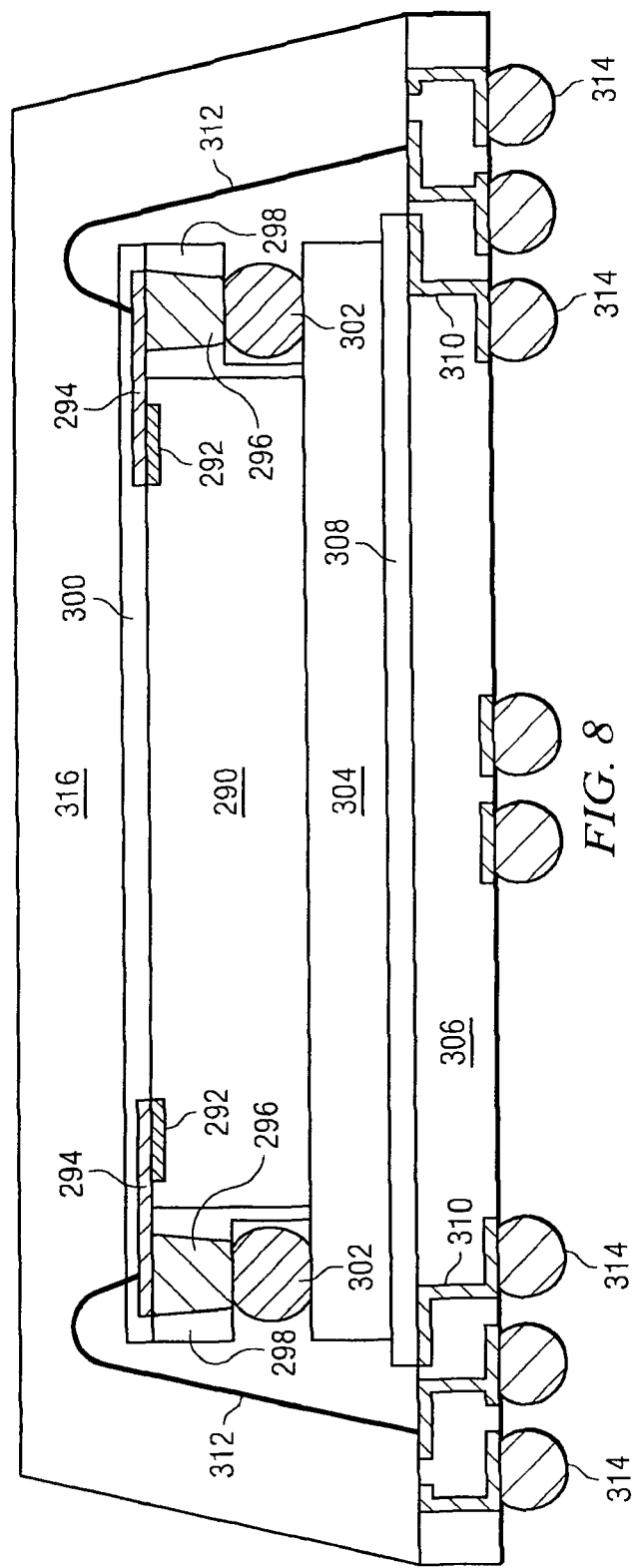
FIG. 8 illustrates a second package-in-package arrangement with vertically stacked semiconductor die having recessed conductive vias.

In other embodiments, any type of semiconductor die or passive device can be mounted to the top of semiconductor die 260 and electrically connected to the PiP device. In addition, any die-to-die interconnectivity configuration can be made. For example, FIG. 8 illustrates a second PiP configuration. Semiconductor die 290 includes contact pads 292 electrically connected through conductive layer 294 to conductive vias 296. The conductive vias 296 are formed in organic material 298 and recessed with respect to the back surface of die 290, as described in FIGS. 3a-3j. Protective layer 300 is formed over conductive layer 294 and semiconductor die 290. Solder bumps 302 are formed on conductive vias 296. Flip chip type semiconductor die 304 is mounted to PCB 306 with adhesive or underfill material 308. Semiconductor die 304 electrically connects to semiconductor die 290 through solder bumps 302. Semiconductor die 290 also electrically connects to interconnect structure 310 in PCB 306 by way of bond wires 312. Solder bumps 314 are formed on interconnect structure 310 to provide external connectivity for the PiP device. A molding compound or encapsulant 316 is deposited over semiconductor device 290 and bond wires 312 and PCB 306. Molding compound 316 can be made with epoxy acrylate or other polymer material and applied by transfer molding, liquid encapsulant molding, or other molding process. Molding compound 316 is non-conductive and environmentally protects the semiconductor device from external elements and contaminants. The stand-off height of encapsulant 316 needed for bond wires 312 can be reduced because some of the space needed for bond wires 312 is provided by the recessed feature of conductive vias 296.

Figure 9:
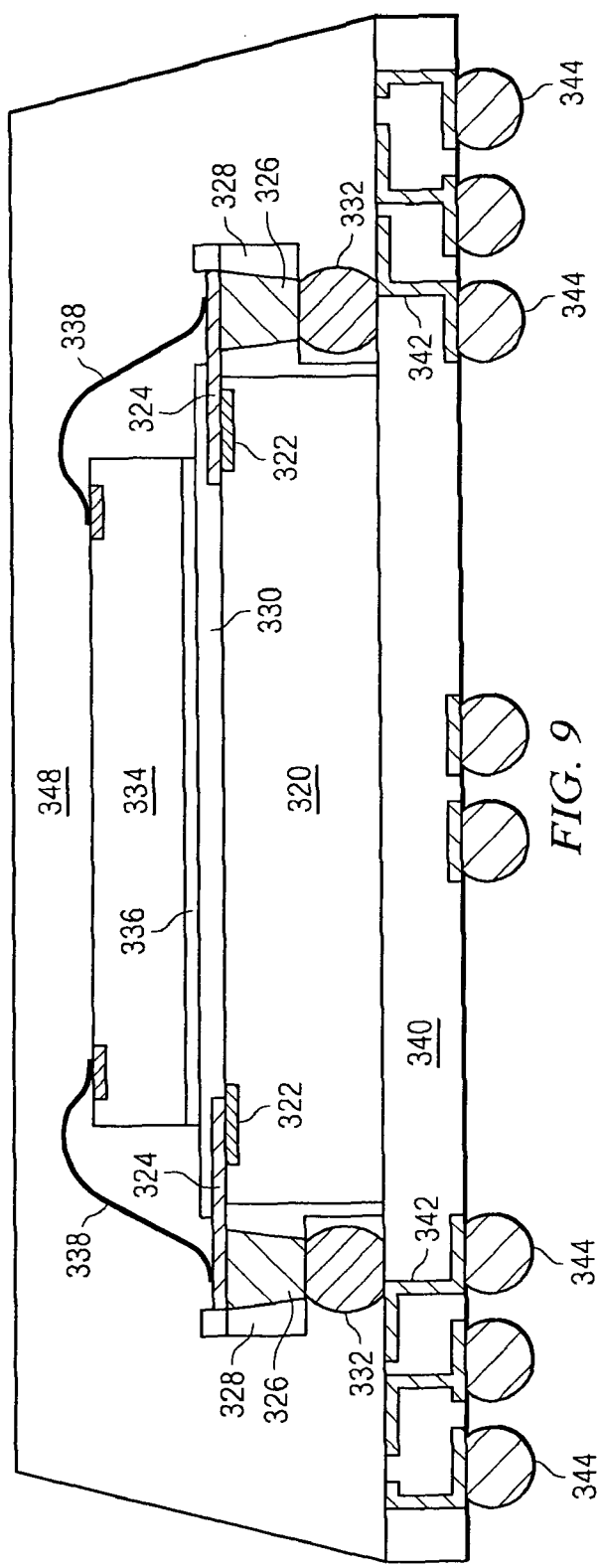
FIG. 9 illustrates a third package-in-package arrangement with vertically stacked semiconductor die having recessed conductive vias.

FIG. 9 illustrates a third PiP configuration. Semiconductor die 320 includes contact pads 322 electrically connected through conductive layer 324 to conductive vias 326. The conductive vias 326 are formed in organic material 328 and recessed with respect to the back surface of die 320, as described in FIGS. 3a-3j. Protective layer 330 is formed over conductive layer 324 and semiconductor die 320. Solder bumps 332 are formed on conductive vias 326. A portion of protective layer 330 is removed by an etching process to expose conductive layer 324. A wire bond type semiconductor die 334 is mounted to semiconductor die 320 with adhesive 336. Semiconductor die 320 electrically connects to contact pads on semiconductor die 334 by way of bond wires 338. The stacked semiconductor die 320 and 334 are mounted to PCB 340. Semiconductor die 320 also electrically connects to interconnect structure 342 on PCB 340 by way of conductive vias 326 and solder bumps 332. Solder bumps 344 are formed on interconnect structure 342 to provide external connectivity for the PiP device. A molding compound or encapsulant 348 is deposited over semiconductor devices 320 and 334 and bond wires 338 and PCB 340. Molding compound 348 can be made with epoxy acrylate or other polymer material and applied by transfer molding, liquid encapsulant molding, or other molding process. Molding compound 348 is non-conductive and environmentally protects the semiconductor device from external elements and contaminants. The overall height of the stacked semiconductor die 320 and 334 is reduced because some of the space needed for solder bumps 332 is provided by the recessed feature of conductive vias 326.

Figure 10:
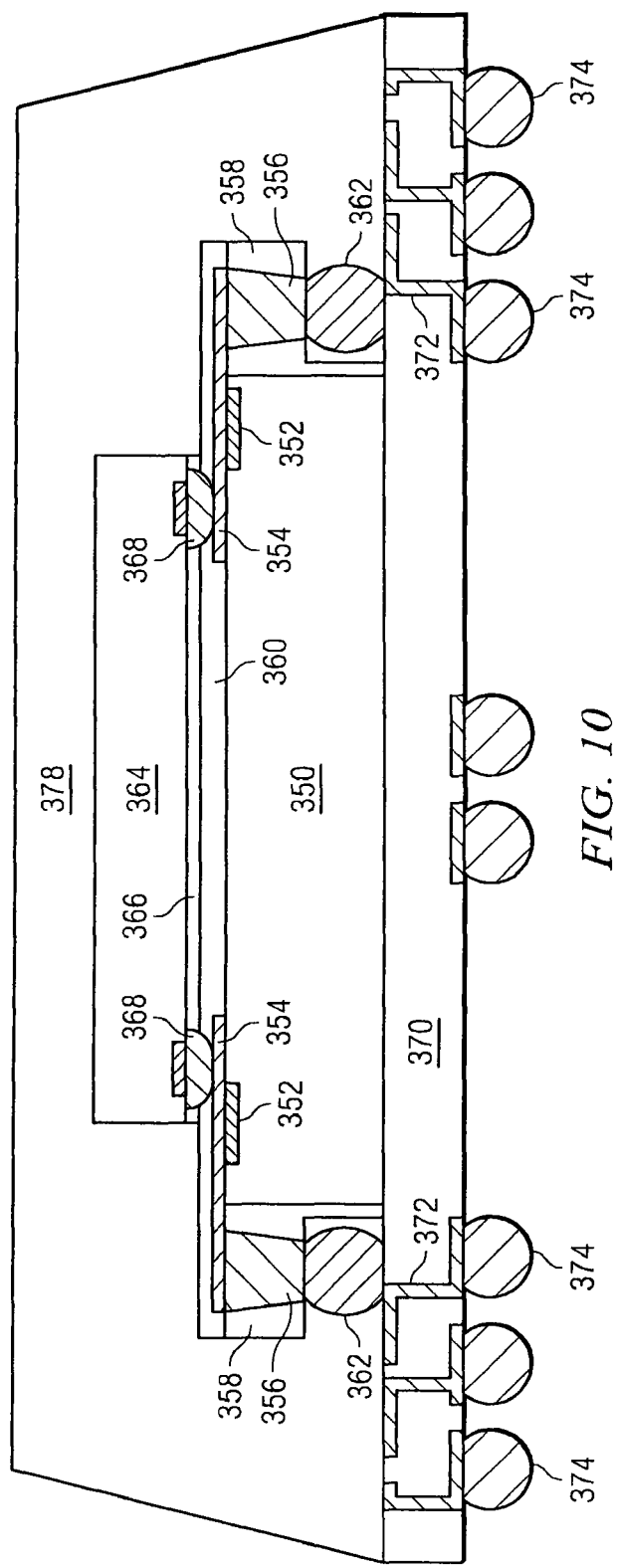
FIG. 10 illustrates a fourth package-in-package arrangement with vertically stacked semiconductor die having recessed conductive vias.

FIG. 10 illustrates a fourth PiP configuration. Semiconductor die 350 includes contact pads 352 electrically connected through conductive layer 354 to conductive vias 356. The conductive vias 356 are formed in organic material 358 and recessed with respect to the back surface of die 350, as described in FIGS. 3a-3j. Protective layer 360 is formed over conductive layer 354 and semiconductor die 350. Solder bumps 362 are formed on conductive vias 356. A portion of protective layer 360 is removed by an etching process to expose conductive layer 354. Flip chip type semiconductor die 364 is mounted to semiconductor die 350 with adhesive or underfill material 366. Solder bumps 368 are formed on contact pads of semiconductor die 364. Semiconductor die 350 electrically connects to the contact pads on semiconductor die 364 by way of solder bumps 368. The stacked semiconductor die 350 and 364 are mounted to PCB 370. Semiconductor die 350 also electrically connect to interconnect structure 372 on PCB 370 by way of conductive vias 356 and solder bumps 362. Solder bumps 374 are formed on interconnect structure 372 to provide external connectivity for the PiP device. A molding compound or encapsulant 378 is deposited over semiconductor devices 350 and 364 and PCB 370. Molding compound 378 can be made with epoxy acrylate or other polymer material and applied by transfer molding, liquid encapsulant molding, or other molding process. Molding compound 378 is non-conductive and environmentally protects the semiconductor device from external elements and contaminants. The overall height of the stacked semiconductor die 350 and 364 is reduced because some of the space needed for solder bumps 362 is provided by the recessed feature of conductive vias 356.

Figure 11:
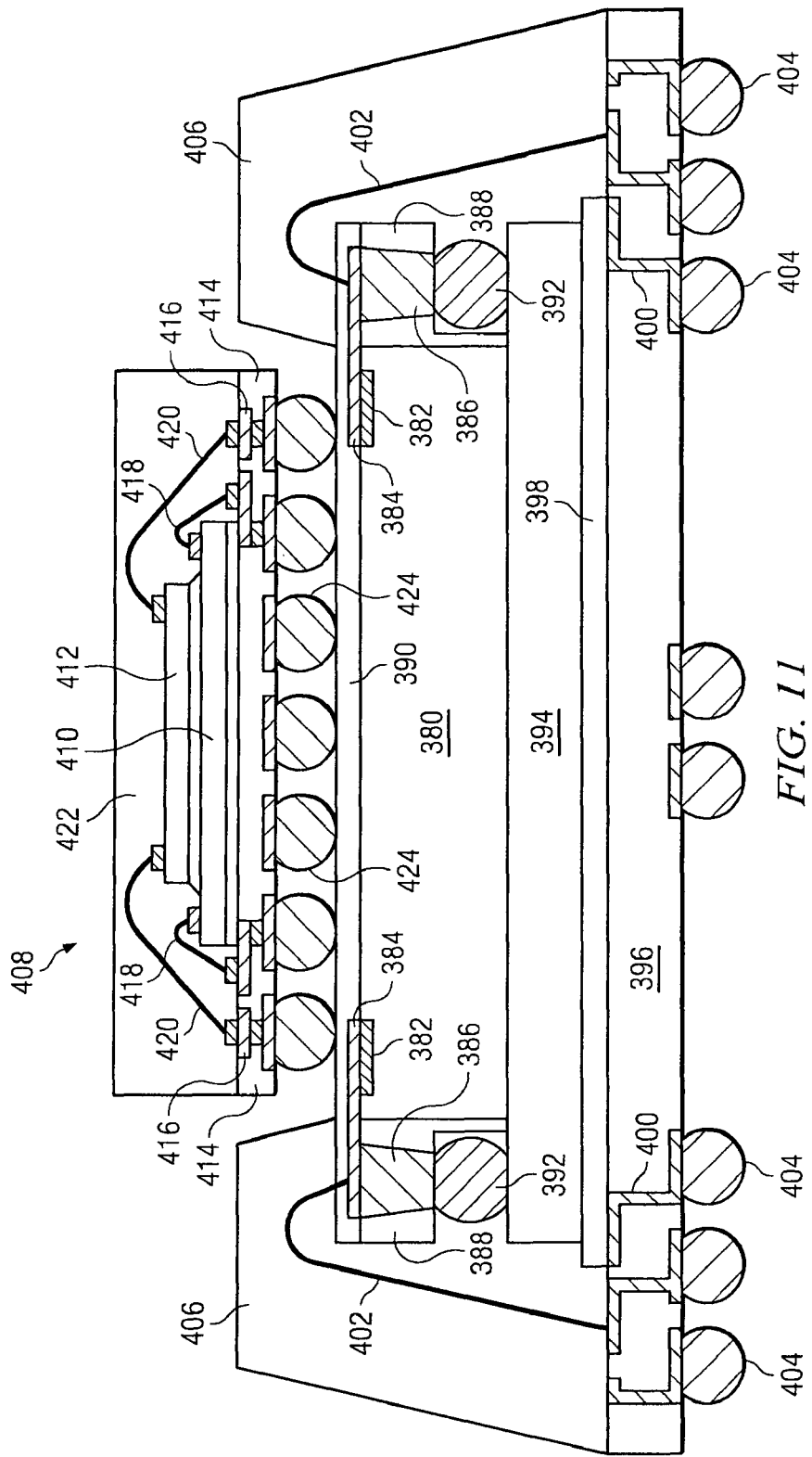
FIG. 11 illustrates fan-in package-on-package arrangement with vertically stacked semiconductor die having recessed conductive vias.

FIG. 11 illustrates a fan-in package-on-package (Fi-PoP) configuration. Semiconductor die 380 includes contact pads 382 electrically connected through conductive layer 384 to conductive vias 386. The conductive vias 386 are formed in organic material 388 and recessed with respect to the back surface of die 380, as described in FIGS. 3a-3j. Protective layer 390 is formed over conductive layer 384 and semiconductor die 380. Solder bumps 392 are formed on conductive vias 386. Flip chip type semiconductor die 394 is mounted to PCB 396 with adhesive 398. Semiconductor die 394 electrically connects to semiconductor die 380 through solder bumps 392. Semiconductor die 380 also electrically connect to interconnect structure 400 in PCB 396 by way of bond wires 402. Solder bumps 404 are formed on interconnect structure 400 to provide external connectivity for the Fi-PoP device. A molding compound or encapsulant 406 is deposited over semiconductor device 380 and bond wires 402. Molding compound 406 can be made with epoxy acrylate or other polymer material and applied by transfer molding, liquid encapsulant molding, or other molding process. Molding compound 406 is non-conductive and environmentally protects the semiconductor device from external elements and contaminants. A portion of encapsulant 406 is removed by an etching process to expose protective layer 390 of semiconductor die 380. Semiconductor package 408 includes semiconductor die 410 and 412 stacked on PCB 414. Semiconductor die 410 and 412 electrically connect to interconnect structure 416 in PCB 414 with bond wires 418 and 420, respectively. An encapsulant 422 is formed over the stack semiconductor die 410 and 412, bond wires 418 and 420, and PCB 414. The interconnect structure 416 of PCB 414 electrically connects to semiconductor die 380 with solder bumps 424. The overall height of the stacked semiconductor die 380 and 394 is reduced because some of the space needed for solder bumps 392 is provided by the recessed feature of conductive vias 386.

Figure 12:
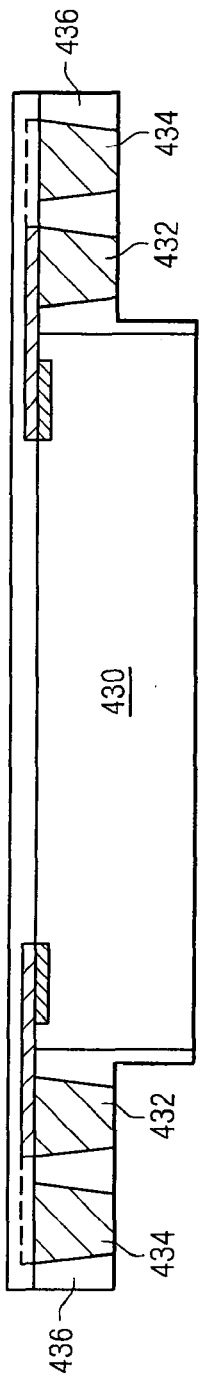
FIG. 12 illustrates a semiconductor die with multiple rows of recessed conductive vias.

In FIG. 12, semiconductor die 430 has two rows of conductive vias 432 and 434 formed in organic material 436 to provide an electrical connection from one side of die 430 to the other side of the die. To form multiple rows of vias 432 and 434, gap 108 is made sufficiently wide to form two side-by-side blind vias like 114 and two side-by-side blind vias like 116 in FIG. 3e. The gap is filled with organic material 112. The blind vias 114 and 116 are each separated by organic material 112 in gap 108. The blind vias 114 and 116 are filled with conductive material 118, as described in FIG. 3f. As a result, two side-by-side conductive vias are formed in gap 108, each surrounded by organic material 112. The cutting tool severs organic material 112 between the conductive vias to provide multiple rows of vias 432 and 434.

Figure 13:
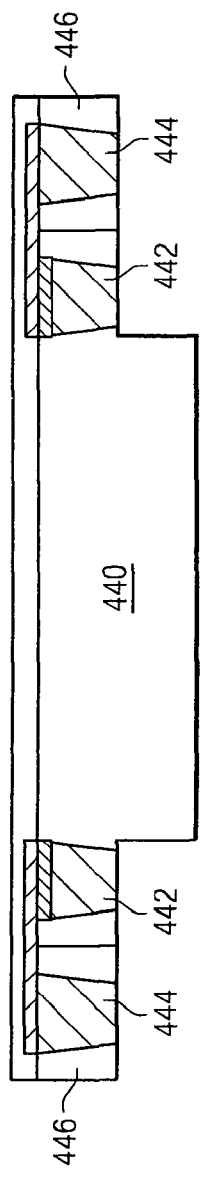
FIG. 13 illustrates a semiconductor die with multiple rows of recessed conductive vias formed in silicon and around a peripheral region of the die.

In FIG. 13, semiconductor die 440 has conductive via 442 formed through the silicon area of die 440. Conductive via 444 is formed through organic material 446 in a peripheral region around die 440, as described in FIGS. 3a-3j.

Figure 14:
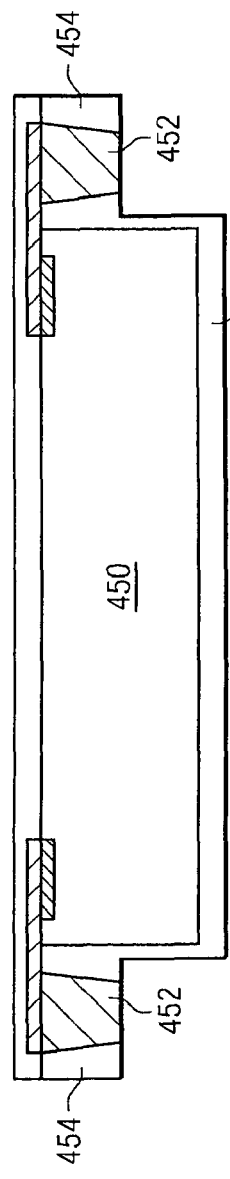
FIG. 14 illustrates a semiconductor die with recessed conductive vias and organic material disposed on a backside of the die.

In FIG. 14, semiconductor die 450 includes conductive vias 452 formed in organic material 454, as described in FIGS. 3a-3j. Organic material 454 is deposited on the backside of semiconductor die 450.

In FIG. 15, semiconductor die 460 has conductive half-vias 462 formed in organic material 464. The conductive half-vias 462 are formed by singulating the semiconductor wafer through the conductive via.

In FIG. 16, semiconductor die 470 has conductive vias 472 formed in organic material 474 to provide an electrical connection from one side of die 470 to the other side of the die. Protective layer 475 is a transparent or translucent material such as quartz glass or polymer material capable of passing light. Semiconductor die 470 includes an optically active area or image sensing area 476 which converts light to electrical signals for processing by the active and passive circuits on the die.

In FIG. 17, semiconductor die 480 has contact pads 482 electrically connected through conductive layer 484 to conductive vias 488. The conductive vias 488 are formed in organic material 490, as described in FIG. 3a-3g. However, conductive vias 488 are not recessed as in FIG. 3h. Instead, conductive vias 488 extend from one side of semiconductor die 480 to the other side of the die. Protective layer 492 is formed over conductive layer 484 and semiconductor die 480 as a transparent or translucent material such as quartz glass or polymer material capable of passing light. Semiconductor die 480 further includes an optically active area or image sensing area 486 which converts light to electrical signals for processing by the active and passive circuits on the die. A dielectric layer 493 is formed on the backside of semiconductor die 480. A portion of dielectric layer 493 is removed to pattern and deposit redistribution layer (RDL) 494. RDL 494 electrically connects to conductive via 488. Contact pads 496 are formed through solder mask 498. Solder bumps can be formed on contact pads 496.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
    a semiconductor die including a contact pad formed on a surface of the semiconductor die;
    an insulating material formed around the semiconductor die with a portion of the insulating material including a thickness less than a thickness of the semiconductor die;
    a conductive via formed through the portion of the insulating material including a thickness less than a thickness of the semiconductor die, wherein the conductive via is singulated to form a conductive half via;
    a conductive layer formed between the conductive half via and contact pad formed on the surface of the semiconductor die;
    a protective layer formed over the surface of the semiconductor die; and
    a bump formed over the conductive half via.

2. The semiconductor device of claim 1, wherein the thickness of the portion of the insulating material is more than fifty percent of the thickness of the semiconductor die.

3. The semiconductor device of claim 1, wherein the conductive via is tapered.

4. The semiconductor device of claim 1, further including a plurality of stacked semiconductor die electrically interconnected through the conductive via.

5. The semiconductor device of claim 1, wherein the semiconductor die includes an optically active area, the protective layer passing light to the optically active area of the semiconductor die.

6. The semiconductor device of claim 1, further including a plurality of rows of conductive half vias.

7. A semiconductor device, comprising:
- a first semiconductor die including a contact pad formed on an active surface of the first semiconductor die;
- an insulating material formed around the first semiconductor die with a portion of the insulating material including a thickness less than a thickness of the first semiconductor die;
- a conductive via formed through the portion of the insulating material including a thickness less than a thickness of the first semiconductor die and a side surface of the conductive via disposed over a side surface of the semiconductor die; and
- a conductive layer formed between the conductive via and contact pad on the surface of the first semiconductor die.

8. The semiconductor device of claim 7, further including a protective layer formed over the active surface of the first semiconductor die.

9. The semiconductor device of claim 7, wherein the thickness of the portion of the insulating material is more than fifty percent of the thickness of the first semiconductor die.

10. The semiconductor device of claim 7, wherein the portion of the insulating material includes a flat profile, rounded profile, or conical profile.

11. The semiconductor device of claim 7, further including a second semiconductor die stacked over the first semiconductor die.

12. The semiconductor device of claim 7, further including a plurality of stacked semiconductor die electrically interconnected through the conductive via.

13. The semiconductor device of claim 7, further including:
- a substrate;
- a second semiconductor die disposed over the substrate;
- the first semiconductor die disposed over the second semiconductor die; and
- an electrical interconnect between the conductive via and substrate.

14. A semiconductor device, comprising:
- a first semiconductor die;
- an insulating material formed around the first semiconductor die with a portion of the insulating material including a thickness less than a thickness of the first semiconductor die; and
- a conductive via formed through the portion of the insulating material including a thickness less than a thickness of the first semiconductor die and a side surface of the conductive via disposed over a side surface of the semiconductor die.

15. The semiconductor device of claim 14, further including:
- a conductive layer formed between the conductive via and a contact pad formed on a second surface of the first semiconductor die; and
- a protective layer formed over the second surface of the first semiconductor die.

16. The semiconductor device of claim 14, wherein the thickness of the portion of the insulating material is more than fifty percent of the thickness of the first semiconductor die.

17. The semiconductor device of claim 14, further including a second semiconductor die stacked over the first semiconductor die.

18. The semiconductor device of claim 14, further including a plurality of stacked semiconductor die electrically interconnected through the conductive via.

19. The semiconductor device of claim 14, further including:
- a substrate;
- the first semiconductor die disposed over the substrate; and
- an electrical interconnect between the conductive via and substrate.

20. A semiconductor device, comprising:
- a first semiconductor die;
- a first insulating material formed around the first semiconductor die with a portion of the first insulating material including a thickness less than a thickness of the first semiconductor die;
- a first conductive via formed through the portion of the first insulating material including a thickness less than a thickness of the first semiconductor die and a side surface of the first conductive via disposed over a side surface of the first semiconductor die;
- a second semiconductor die disposed over the first semiconductor die;
- a second insulating material formed around the second semiconductor die with a portion of the second insulating material including a thickness less than a thickness of the second semiconductor die; and
- a second conductive via formed through the portion of the second insulating material including a thickness less than a thickness of the second semiconductor die.

21. The semiconductor device of claim 20, wherein the first insulating material extends laterally beyond the first semiconductor die.

22. The semiconductor device of claim 20, further including:
- a conductive layer formed between the first conductive via and a contact pad formed on a second surface of the first semiconductor die; and
- a protective layer formed over the second surface of the first semiconductor die.

23. The semiconductor device of claim 20, wherein the thickness of the portion of the first insulating material is more than fifty percent of the thickness of the first semiconductor die and the thickness of the portion of the second insulating material is more than fifty percent of the thickness of the second semiconductor die.

24. The semiconductor device of claim 20, further including:
- a substrate;
- the first and second semiconductor die disposed over the substrate; and
- an electrical interconnect between the first and second conductive via and substrate.

* * * * *

UNITED STATES PATENT AND TRADEMARK OFFICE
CERTIFICATE OF CORRECTION

| | | |
|---|---|---|
| PATENT NO. | : 9,006,882 B2 | Page 1 of 1 |
| APPLICATION NO. | : 12/719398 | |
| DATED | : April 14, 2015 | |
| INVENTOR(S) | : Reza A. Pagaila et al. | |

It is certified that error appears in the above-identified patent and that said Letters Patent is hereby corrected as shown below:

In the Claims

Column 13, line 3, insert --half-- between "conductive" and "via".

Signed and Sealed this
Eighth Day of September, 2015

Michelle K. Lee
*Director of the United States Patent and Trademark Office*